United States Patent
Lindgren et al.

(10) Patent No.: US 9,679,102 B2
(45) Date of Patent: Jun. 13, 2017

(54) STRUCTURE PLACEMENT USING PRIOR DESIGN LOCATION IDENTIFICATION AND FEEDBACK

(71) Applicant: The Boeing Company, Chicago, IL (US)

(72) Inventors: Lawrence Stimson Lindgren, Redmond, WA (US); Len M. Baublitz, Greenbank, WA (US)

(73) Assignee: THE BOEING COMPANY, Chicago, IL (US)

( * ) Notice: Subject to any disclaimer, the term of this patent is extended or adjusted under 35 U.S.C. 154(b) by 536 days.

(21) Appl. No.: 13/860,846

(22) Filed: Apr. 11, 2013

(65) Prior Publication Data

US 2015/0205910 A1 Jul. 23, 2015

(51) Int. Cl.
G06F 17/50 (2006.01)

(52) U.S. Cl.
CPC ...... *G06F 17/5095* (2013.01); *G06F 17/5004* (2013.01)

(58) Field of Classification Search
None
See application file for complete search history.

(56) References Cited

U.S. PATENT DOCUMENTS

| 7,529,649 | B2 | 5/2009 | Lee et al. | |
|---|---|---|---|---|
| 8,060,345 | B2 | 11/2011 | Lee et al. | |
| 8,170,843 | B2 | 5/2012 | Lee | |
| 9,058,464 | B2 | 6/2015 | Song et al. | |
| 2005/0209830 | A1* | 9/2005 | Lee et al. | 703/1 |
| 2007/0027856 | A1 | 2/2007 | Lee | |
| 2010/0145492 | A1 | 6/2010 | Russell | |
| 2010/0235206 | A1* | 9/2010 | Miller et al. | 705/7 |
| 2012/0065944 | A1* | 3/2012 | Nielsen et al. | 703/1 |
| 2013/0158955 | A1 | 6/2013 | Song et al. | |
| 2014/0012545 | A1* | 1/2014 | Tsongas et al. | 703/1 |

FOREIGN PATENT DOCUMENTS

EP 2790117 A1 10/2014

OTHER PUBLICATIONS

Sims, Dave. "New realities in aircraft design and manufacture." Computer Graphics and Applications, IEEE 14.2 (1994): 91.*
Rolland, Romain, et al. "E-commerce and Web 3D for involving the customer in the design process: the case of a gates 3D configurator." Proceedings of the 2012 Virtual Reality International Conference. ACM, 2012.*
Extended European Search Report, dated Jul. 7, 2014, regarding Application No. EP14158823.6, 6 pages.
Whang et al., "Layout of Passenger Arrangements Implementation Using Previously Designed Configurations," U.S. Appl. No. 14/879,372, filed Oct. 9, 2015, 59 pages.
Extended European Search Report, dated Mar. 31, 2017, regarding Application 16179761.8, 10 pages.

* cited by examiner

Primary Examiner — Omar Fernandez Rivas
Assistant Examiner — Nithya J Moll
(74) Attorney, Agent, or Firm — Yee & Associates, P.C.

(57) ABSTRACT

A system and method for placing a structure in a design for an interior of an aircraft. An initial placement for the structure is received by a processor unit. A suggested placement for the structure is identified by the processor unit from a number of structure placement engineering designs in an engineering design database for the aircraft using the initial placement. The suggested placement for the structure is displayed by the processor unit.

18 Claims, 8 Drawing Sheets

STRUCTURE PLACEMENT USING PRIOR DESIGN LOCATION IDENTIFICATION AND FEEDBACK

BACKGROUND INFORMATION

1. Field:

The present disclosure relates generally to placing structures in a design for the interior of an aircraft or other platform. Still more particularly, the present disclosure relates to a system and method for identifying relevant prior engineering designs for the placement of such structures and providing feedback to designers for the placement of structures using such prior designs.

2. Background:

Designing an aircraft or other platform may include placing various structures in a design for the aircraft or other platform. For example, designing a commercial passenger aircraft or other aircraft may include placing various structures in a design for a passenger cabin or other area on the interior of the aircraft. The various structures that may be placed at various locations in the design for the interior of the aircraft may be referred to as monuments or commodities. For example, without limitation, such structures may include lavatories, galleys, closets, bar units, seats, walls, dividers, partitions, and other structures or combinations of structures.

A designer may use a computer-implemented design tool to indicate the desired placement for various structures in a design for the interior of an aircraft or other platform. In order for an aircraft or other platform having such a design to be manufactured, the placement of each structure in the design for the interior of the aircraft or other platform is converted into a detailed engineering design. For example, such an engineering design may specify structural, mechanical, electrical, heating, air circulation, water supply, waste water drainage, or various other components, connections, or combinations of components and connections for implementing the desired placement of the structure in the design for the interior of the aircraft or other platform. The creation of such an engineering design may be relatively time-consuming. For example, each placement of a galley in the design for the interior of an aircraft may require up to 1,000 hours or more of engineering time to design the flooring structure to support the galley and the electrical wiring, plumbing, and other components and connections for implementing the galley at the placement specified in the design.

Therefore, the placement of structures in a design for the interior of an aircraft or other platform may present a number of technical problems that may require many hours of engineering time to solve. A detailed engineering design for the placement of a structure in the interior of an aircraft or other platform may need to be created. This detailed engineering design then may be used to implement the design for the interior of the aircraft or other platform during manufacturing of the aircraft or other platform. However, current systems and methods for designing aircraft and other platforms do not provide for the use of such engineering designs for the initial placement of structures in the design for the interior of the aircraft or other platform.

The illustrative embodiments provide a technical solution to the problem of generating engineering designs for the placements of structures in a design for the interior of an aircraft or other platform. In accordance with an illustrative embodiment, completed engineering designs for the placements of various structures in designs for the interior of an aircraft or other platform may be stored in a database of completed engineering designs. A design configuration tool may be configured to provide feedback to a designer during the placement of structures in a new design for the interior of an aircraft or other structure using the information stored in the engineering design database. Such feedback may allow the designer to select the placement of structures in the design for the interior of an aircraft or other platform in a manner that may reduce the engineering time and cost for implementing the design.

Accordingly, it would be beneficial to have a method and apparatus that takes into account one or more of the issues discussed above, as well as possibly other issues.

SUMMARY

An illustrative embodiment of the present disclosure provides a method for placing a structure in a design for an interior of an aircraft. An initial placement for the structure is received by a processor unit. A suggested placement for the structure is identified by the processor unit from a number of structure placement engineering designs in an engineering design database for the aircraft using the initial placement. The suggested placement for the structure is displayed by the processor unit.

Another illustrative embodiment of the present disclosure provides an apparatus comprising an engineering design database, a user interface, and a suggested placement identifier. The engineering design database comprises a number of structure placement engineering designs. The user interface is configured to receive an initial placement for a structure in a design and to display a suggested placement for the structure. The suggested placement identifier is configured to identify the suggested placement for the structure from the number of structure placement engineering designs using the initial placement.

Another illustrative embodiment of the present disclosure provides a method for placing a structure in a design. An initial placement for the structure comprising a location for the structure in the design is received by a processor unit. A number of structure placement engineering designs in an engineering design database are identified by the processor unit for a similar structure to the structure and with a similar location to the location. A suggested placement for the structure comprising a suggested location for the structure and a suggested substitute structure for the structure corresponding to the number of structure placement engineering designs is displayed by the processor unit.

The features, functions, and benefits can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and benefits thereof, will best be understood by reference to the following detailed description of illustrative embodiments of the present disclosure when read in conjunction with the accompanying drawings, wherein:

DETAILED DESCRIPTION

The different illustrative embodiments recognize and take into account a number of different considerations. "A number," as used herein with reference to items, means one or more items. For example, "a number of different considerations" means one or more different considerations.

The different illustrative embodiments recognize and take into account that it may be desirable for the design of the interior of a commercial passenger aircraft or other aircraft to be flexible. For example, an aircraft manufacturer may desire to allow customers to select the placement of various structures in the design for the interior of an aircraft in a flexible manner.

The different illustrative embodiments also recognize and take into account, however, that a detailed engineering design may need to be created for each placement of a structure in a design for the interior of an aircraft in order for the design to be implemented. The creation of such engineering designs presents a technical problem. The creation of such engineering designs may take considerable time and may add to the cost of the aircraft.

The different illustrative embodiments recognize and take into account that engineering designs for placements of structures in designs for the interior of an aircraft may be saved. Engineering design time and costs may be reduced if prior engineering designs can be used to implement the placements of structures in new designs for the interior of the aircraft. However, there is currently no effective system or method for allowing a designer to take advantage of such prior engineering designs to place structures in new designs for the interior of the aircraft.

Therefore, the illustrative embodiments provide a technical solution to the problem of creating an engineering design for implementing the placement of a structure in a design for the interior of an aircraft by using information on prior engineering designs to provide feedback to a designer during placement of a structure in the design for the interior of the aircraft. For example, the illustrative embodiments may comprise a design configuration tool and a corresponding method that are configured to identify and display suggested placements for a structure in the design for the interior of the aircraft for which prior engineering designs are available. The designer may use the design configuration tool to select a suggested placement for the structure in the design for the interior of the aircraft. In this case, a prior engineering design for the selected suggested placement may be used to implement the design for the interior of the aircraft during manufacturing. Engineering time and cost may be saved by selecting a suggested placement for the structure in the design for the interior of the aircraft for which a prior engineering design is available.

In accordance with an illustrative embodiment, a design configuration tool and method may be configured to receive an initial placement for a structure in a design for the interior of an aircraft from a designer or other user. Information for prior engineering designs in an engineering design database may be used to identify placements for structures in the design for the interior of the aircraft for which prior engineering designs are available and that may be acceptable alternatives to the initial placement made by the designer. A number of alternative suggested placements corresponding to existing prior engineering designs may be displayed in response to receiving the initial placement made by the designer. An indication of the savings associated with using a suggested placement in the design for the interior of the aircraft also may be displayed.

Figure 1:
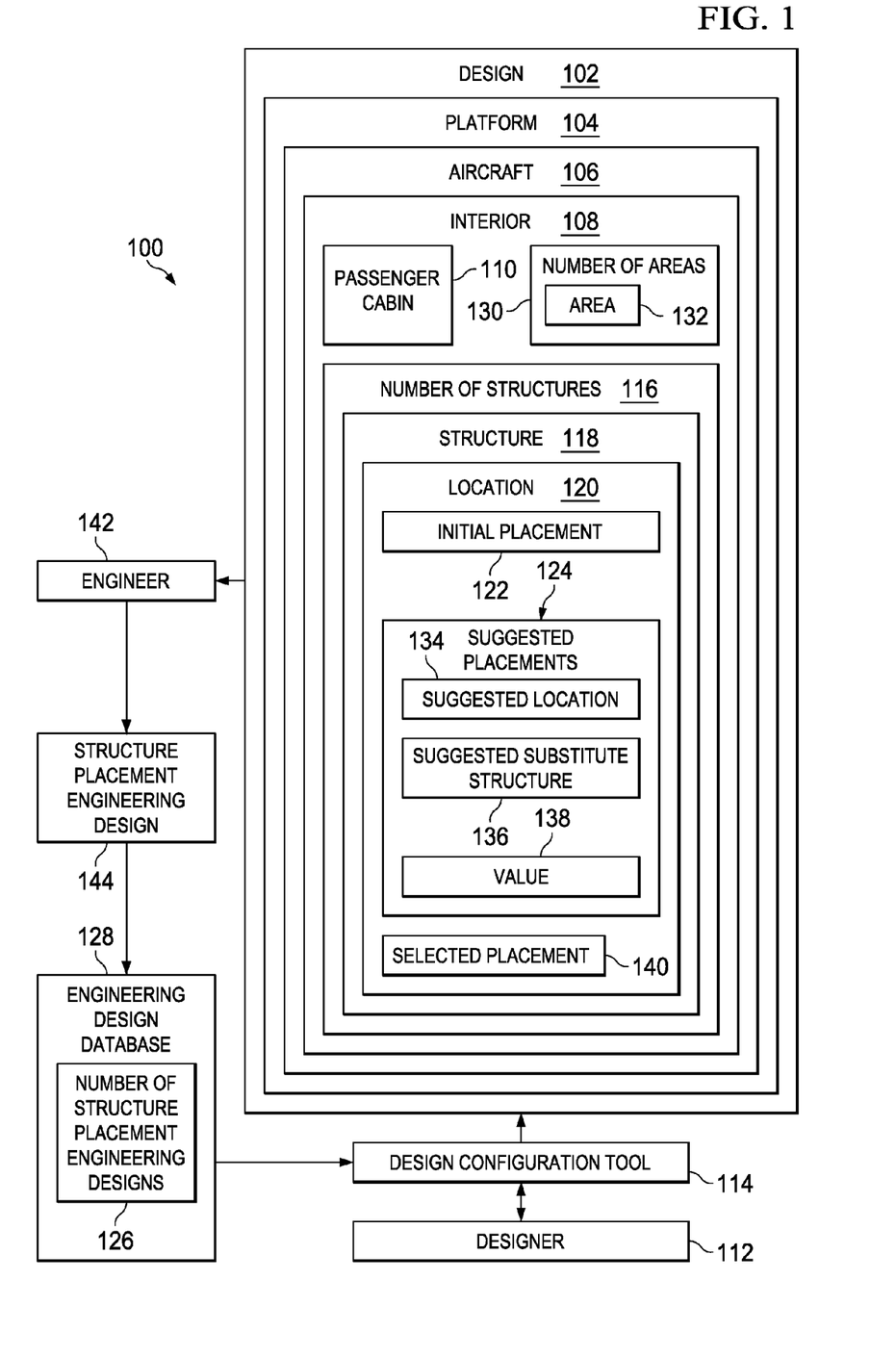
FIG. 1 is an illustration of a block diagram of a design environment in accordance with an illustrative embodiment.

Turning now to FIG. 1, an illustration of a block diagram of a design environment is depicted in accordance with an illustrative embodiment. Design environment 100 may be configured for creating design 102 for platform 104. For example, design 102 may include information for identifying various components of platform 104 and the relationships between those components to form platform 104.

Platform 104 may include any mobile or non-mobile platform. For example, platform 104 may be a vehicle or other mobile platform. For example, without limitation, platform 104 may include any vehicle configured for operation on land, on water, under water, in air, in space, or in any other environment or combination of environments. For example, without limitation, platform 104 may be a passenger ferry or other vehicle configured for operating on the water, a bus, a passenger train, or another vehicle configured for traveling over land.

For example, platform 104 may be aircraft 106. Aircraft 106 may include any type of aircraft. For example, aircraft 106 may include fixed wing, rotary wing, or lighter-than-air aircraft. Aircraft 106 may be configured for any appropriate purpose or mission. For example, without limitation, aircraft 106 may be a commercial passenger aircraft, a cargo aircraft, a military aircraft, or any other type of aircraft configured for any appropriate type of operation or combination of operations.

Platform 104 may include interior 108. Interior 108 of platform 104 may be configured for any purpose or combination of purposes. For example, without limitation, interior 108 of aircraft 106 may include passenger cabin 110 or any other space in interior 108 of aircraft 106.

In accordance with an illustrative embodiment, designer 112 may use design configuration tool 114 to create design 102 for interior 108 of platform 104. For example, designer 112 may use design configuration tool 114 to identify number of structures 116 to be included in design 102 for interior 108. Designer 112 may use design configuration tool 114 to designate the placement of number of structures 116 in design 102 for interior 108.

Designer 112 may be any appropriate human user or operator of design configuration tool 114. For example, designer 112 may be employed by a manufacturer of platform 104, by a customer of the manufacturer of platform 104, or by any other appropriate entity. For example, without limitation, designer 112 may be employed by a manufacturer of aircraft 106 or by a customer purchasing aircraft 106 from the manufacturer of aircraft 106.

Design configuration tool 114 may be implemented on a computer or other data processing system. For example, without limitation, design configuration tool 114 may be implemented as part of, or may be connected to, a computer-aided design, computer-aided engineering, or computer-aided manufacturing tool or system or any other appropriate computer-based tool or system for creating or using design 102 for platform 104. Alternatively, design configuration tool 114 may be implemented as a stand-alone tool that is separate from other computer-based tools or systems for the design or manufacturing of platform 104.

Design configuration tool 114 may be configured to allow designer 112 to designate the placement of number of structures 116 in design 102 for interior 108 of platform 104. In the present application, unless stated otherwise or otherwise clear from the context in which it is used, the "placement" of a structure in a design for the interior of an aircraft or other platform includes information for identifying the structure and information for identifying the location of the structure in the design. Therefore, design configuration tool 114 may be configured to allow designer 112 to identify structure 118 in number of structures 116 to be included in design 102 for interior 108 of platform 104 and to designate location 120 of structure 118 in design 102 for interior 108. In the present application, unless stated otherwise or otherwise clear from the context in which it is used, the "location" of a structure in a design for the interior of an aircraft or other platform may include information for identifying the point or points in the design at which the structure is located, the orientation of the structure in the design, or both.

Designer 112 may use design configuration tool 114 to select initial placement 122 for structure 118 in design 102 for interior 108. Initial placement 122 may include information for identifying both structure 118 and location 120 at which structure 118 is placed in design 102 for interior 108.

Design configuration tool 114 may be configured to use initial placement 122 received from designer 112 to identify suggested placements 124 for structure 118 in design 102 for interior 108. In accordance with an illustrative embodiment, suggested placements 124 may correspond to number of structure placement engineering designs 126 in engineering design database 128. Number of structure placement engineering designs 126 may include engineering designs for various structures at various locations in the interior of a platform that is the same as or similar to platform 104 for which design 102 is being created using design configuration tool 114.

Number of structure placement engineering designs 126 may be stored in engineering design database 128. Engineering design database 128 may include any appropriate database structure for storing number of structure placement engineering designs 126 for use by design configuration tool 114. Engineering design database 128 may be part of design configuration tool 114 or separate from, but accessible by, design configuration tool 114.

Suggested placements 124 may include placements corresponding to number of structure placement engineering designs 126 in engineering design database 128 that are similar to initial placement 122. In this application, unless stated otherwise or otherwise clear from the context in which it is used, "similar to" is understood to include, without limitation, "the same as". Therefore, suggested placements 124 may include placements that may be acceptable alternatives to initial placement 122 made by designer 112. For example, design configuration tool 114 may be configured to identify number of structure placement engineering designs 126 in engineering design database 128 for structures that are similar to structure 118 identified in initial placement 122 at locations that are similar to location 120 identified in initial placement 122.

Number of structure placement engineering designs 126 may be determined to be for structures similar to structure 118 identified in initial placement 122 using any appropriate method or combination of methods. For example, number of structure placement engineering designs 126 may be considered to be for structures similar to structure 118 identified in initial placement 122 when number of structure placement engineering designs 126 are for a structure that is the same as, or of the same type as, structure 118 identified in initial placement 122.

Number of structure placement engineering designs 126 may be determined to be for a location similar to location 120 identified in initial placement 122 using any appropriate method or combination of methods. For example, design 102 for interior 108 may be divided into number of areas 130. Number of areas 130 also may be referred to as zones or another appropriate term. Location 120 for structure 118 as identified in initial placement 122 may be in area 132 in number of areas 130 of design 102 for interior 108. Number of structure placement engineering designs 126 may be considered to be for a location similar to location 120 identified in initial placement 122 when number of structure placement engineering designs 126 are for a location that is in the same area 132 in design 102 as location 120 identified in initial placement 122.

Suggested placements 124 may be displayed to designer 112 by design configuration tool 114. For example, the display of each one of suggested placements 124 may include an indication of suggested location 134, suggested substitute structure 136, or both. Suggested location 134 and suggested substitute structure 136 may correspond to the location and structure of number of structure placement engineering designs 126 in engineering design database 128 that are similar to initial placement 122 made by designer 112. Therefore, suggested location 134 may be similar to location 120 identified in initial placement 122. Similarly, suggested substitute structure 136 may be a structure that is similar to structure 118 identified in initial placement 122.

Engineering time may be saved, and the cost of platform 104 reduced, if one of suggested placements 124 is used for the placement of structure 118 in design 102 for interior 108 of platform 104. Such savings and cost reduction may be realized because suggested placements 124 correspond to prior placements in a design for interior 108 of platform 104 for which number of structure placement engineering designs 126 have already been developed. If one of suggested placements 124 is not used for the placement of structure 118 in design 102 for interior 108, detailed engineering designs for the placement of structure 118 in design 102 for interior 108 may need to be developed.

An indication of value 138 associated with using suggested placements 124 for structure 118 in design 102 for interior 108 may be displayed to designer 112 by design configuration tool 114 along with the display of suggested placements 124. Design configuration tool 114 may be configured to identify value 138 associated with suggested placements 124. For example, the indication of value 138 displayed to designer 112 may provide some indication of the amount of savings that may be realized by using suggested placements 124, for which number of structure placement engineering designs 126 have already been developed, in design 102 for interior 108. Designer 112 may take the displayed indication of value 138 into account when determining whether to use suggested placements 124 for structure 118 in design 102 for interior 108, or which of suggested placements 124 for structure 118 to use in design 102 for interior 108.

Designer 112 may use design configuration tool 114 to select selected placement 140 for structure 118 in design 102 for interior 108 of platform 104. Selected placement 140 may be the placement for structure 118 in design 102 for interior 108 that is used for manufacturing platform 104. Selected placement 140 may be initial placement 122, one of suggested placements 124, or another placement for structure 118 in design 102 for interior 108 of platform 104.

Selected placement 140 may be provided to engineer 142. Engineer 142 may be any person, group, or other entity for developing structure placement engineering design 144 for selected placement 140. Structure placement engineering design 144 may comprise a more detailed engineering design for the implementation of selected placement 140 in design 102 for interior 108 of platform 104. For example, structure placement engineering design 144 may be used to implement selected placement 140 for structure 118 in interior 108 of platform 104 during manufacturing of platform 104.

If selected placement 140 is one of suggested placements 124, then selected placement 140 may correspond to number of structure placement engineering designs 126 in engineering design database 128. In this case, engineer 142 may use or otherwise take advantage of number of structure placement engineering designs 126 in engineering design database 128 to create structure placement engineering design 144 for selected placement 140. In this case, less time and effort may be required to develop structure placement engineering design 144.

If selected placement 140 is not one of suggested placements 124, then engineer 142 may develop structure placement engineering design 144 for the placement of structure 118 in design 102 for interior 108 of platform 104 without the assistance of number of structure placement engineering designs 126 already developed. In this case, more time and effort may be required to develop structure placement engineering design 144.

Structure placement engineering design 144 for selected placement 140 may be added to number of structure placement engineering designs 126 in engineering design database 128. Number of structure placement engineering designs 126 in engineering design database 128 may continue to grow as new structure placement engineering designs are developed and stored in engineering design database 128. Therefore, design configuration tool 114 may make use of a growing number of structure placement engineering designs 126 in engineering design database 128 to identify suggested placements 124 to display to designer 112 when designer 112 uses design configuration tool 114 to place number of structures 116 in design 102 for interior 108 of platform 104. As number of structure placement engineering designs 126 in engineering design database 128 grows, it may be more likely that suggested placements 124 for number of structures 116 in design 102 for interior 108 of platform 104 are identified and are acceptable to designer 112. In this case, it may be more likely that suggested placements 124 displayed to designer 112 by design configuration tool 114 may be selected by designer 112 as selected placement 140. Therefore, as number of structure placement engineering designs 126 in engineering design database 128 grows over time, it may become more likely that fewer new structure placement engineering designs need to be developed, thereby reducing the cost of implementing future platform designs.

Figure 2:
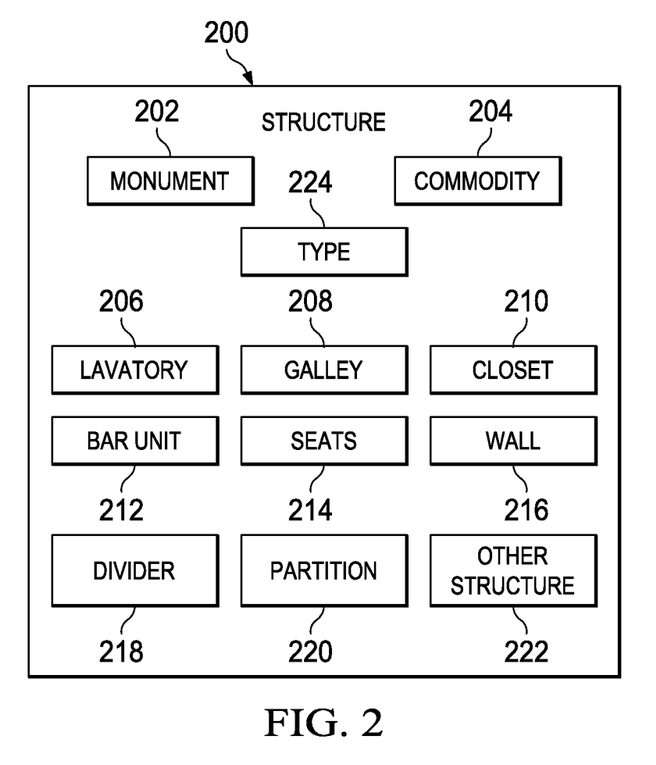
FIG. 2 is an illustration of a block diagram of a structure in accordance with an illustrative embodiment.

Turning now to FIG. 2, an illustration of a block diagram of a structure is depicted in accordance with an illustrative embodiment. In this example, structure 200 may be an example of one implementation of structure 118 for interior 108 of aircraft 106 or other platform 104 in FIG. 1.

Structure 200 may be referred to as monument 202, commodity 204, or using any other appropriate term. For example, without limitation, structure 200 may include lavatory 206, galley 208, closet 210, bar unit 212, seats 214, wall 216, divider 218, partition 220, other structure 222, or various combinations of structures for the interior of an aircraft or other platform.

Structure 200 may be defined by type 224. Type 224 may be used to identify characteristics of structure 200 that may be shared by other structures. For example, without limitation, type 224 may be used to identify a general function performed by structure 200 in the interior of an aircraft or other platform or another general characteristic or combination of characteristics of structure 200. In accordance with an illustrative embodiment, type 224 may be used to identify structures that are similar to structure 200 or to determine whether structure 200 is similar to another structure. For example, structure 200 may be considered to be similar to another structure if both structure 200 and the other structure have the same type 224. Thus, type 224 may be used to determine whether structure 200 may be an appropriate substitute for the other structure, or vice versa, in a design for the interior of an aircraft or other platform.

Figure 3:
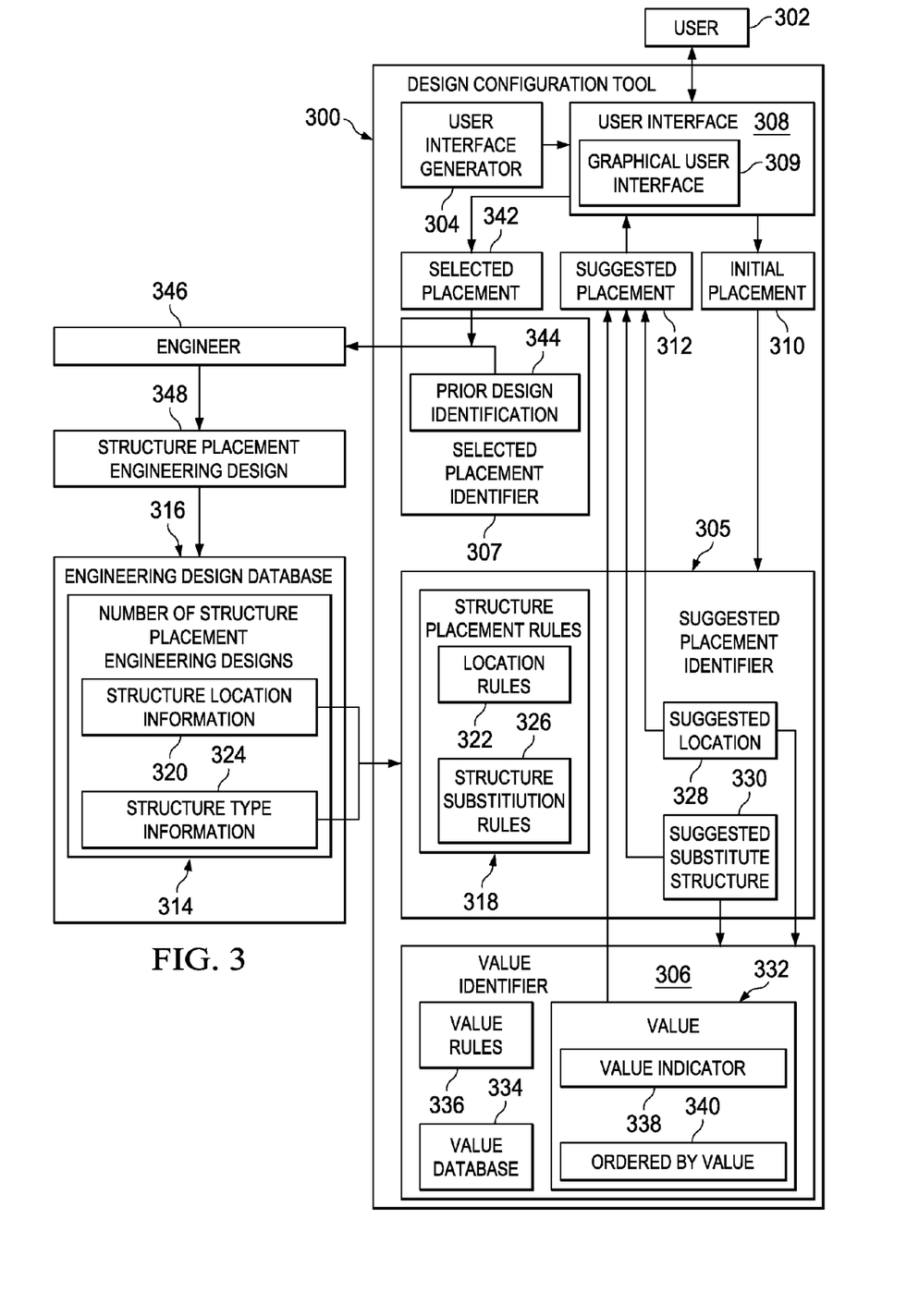
FIG. 3 is an illustration of a block diagram of a design configuration tool in accordance with an illustrative embodiment.

Turning now to FIG. 3, an illustration of a block diagram of a design configuration tool is depicted in accordance with an illustrative embodiment. In this example, design configuration tool 300 may be an example of one implementation of design configuration tool 114 in FIG. 1.

Design configuration tool 300 may be implemented in a computer or other data processing system using appropriate hardware or appropriate software in combination with hardware. In this example, the computer or other data processing system may be configured to perform the various functions of design configuration tool 300 described herein.

User 302 may use design configuration tool 300 to place structures in a design for the interior of an aircraft or other platform. For example, without limitation, designer 112 in FIG. 1 may be an example of user 302. In accordance with an illustrative embodiment, design configuration tool 300 may include user interface generator 304, suggested placement identifier 305, value identifier 306, and selected placement identifier 307.

User interface generator 304 may be configured to generate user interface 308. For example, user interface 308 may include graphical user interface 309. User interface 308 may be configured to allow user 302 to interact with design configuration tool 300 to use design configuration tool 300 to place structures in the design for the interior of an aircraft or other platform. User interface 308 may be displayed to user 302 on any appropriate display device. User 302 may provide input to design configuration tool 300 via user interface 308 using any appropriate input device.

User interface 308 may be configured to receive initial placement 310 as input from user 302. Initial placement 310 may identify the placement of a structure in the design for the interior of the aircraft or other platform. Initial placement 310 may include information identifying both the structure being placed in the design as well as a location in the design at which the structure is being placed.

Suggested placement identifier 305 may be configured to use initial placement 310 to identify suggested placement 312. Suggested placement identifier 305 may be configured to identify suggested placement 312 from number of structure placement engineering designs 314 in engineering design database 316. In this example, number of structure placement engineering designs 314 in engineering design database 316 may be an example of one implementation of number of structure placement engineering designs 126 in engineering design database 128 in FIG. 1.

Engineering design database 316 may include structure location information 320 and structure type information 324 for number of structure placement engineering designs 314. Structure location information 320 may include information for identifying the locations in designs for the interior of an aircraft or other platform of number of structure placement engineering designs 314. Structure type information 324 may include information for identifying the types of structures of number of structure placement engineering designs 314.

Suggested placement identifier 305 may be configured to identify suggested placement 312 from number of structure placement engineering designs 314 using initial placement 310 and structure placement rules 318. Structure placement rules 318 may include rules for identifying which of number of structure placement engineering designs 314 in engineering design database 316 are for placements of structures in a design for the interior of an aircraft or other platform that may be acceptable alternatives for a given initial placement 310. Structure placement rules 318 may be implemented in any appropriate form and manner for use by suggested placement identifier 305. For example, without limitation, structure placement rules 318 may include location rules 322 and structure substitution rules 326.

Location rules 322 may include rules for determining whether a location for number of structure placement engineering designs 314 in engineering design database 316, as identified in structure location information 320, is similar to the location for a structure identified in initial placement 310. For example, without limitation, location rules 322 may define a location for number of structure placement engineering designs 314 identified in structure location information 320 as being similar to the location for a structure identified in initial placement 310 if the location identified in structure location information 320 is in the same area or zone of a design for the interior of an aircraft or other platform as the location identified in initial placement 310. In this case, the areas or zones used to determine whether the locations are similar may be defined in location rules 322.

Location rules 322 may depend on the particular structure or type of structure being placed. Different location rules 322 may be used by suggested placement identifier 305 for different structures or types of structures. For example, the areas or zones of a design that may be used to determine whether locations are similar, as described in the example above, may be defined differently in location rules 322 for different structures or types of structures being placed.

Structure substitution rules 326 may include rules for identifying structures that may be used in place of the structure identified in initial placement 310. For example, without limitation, structure substitution rules 326 may include rules defining which types of structures may acceptable alternatives for the structure identified in initial placement 310. In this case, suggested placement identifier 305 may use structure substitution rules 326 and structure type information 324 for number of structure placement engineering designs 314 to identify number of structure placement engineering designs 314 in engineering design database 316 that are for structures of the same or similar type as the structure identified in initial placement 310.

Therefore, in accordance with an illustrative embodiment, suggested placement identifier 305 may use structure placement rules 318 to identify number of structure placement engineering designs 314 in engineering design database 316 that are for a similar structure and are at a similar location in the design for an interior of a platform as the structure and location identified in initial placement 310. Number of structure placement engineering designs 314 that satisfy these criteria may be identified as suggested placement 312.

Suggested placement 312 may be displayed to user 302 on user interface 308 in any appropriate manner. For example, without limitation, suggested placement 312 displayed on user interface 308 may include an indication of suggested location 328 for suggested placement 312 and an indication of suggested substitute structure 330 for suggested placement 312. In this case, suggested location 328 and suggested substitute structure 330 correspond to the location and structure for number of structure placement engineering designs 314 in engineering design database 316 that have been determined by suggested placement identifier 305 to be similar to, and therefore, likely acceptable alternative options for, initial placement 310.

Information identifying suggested placement 312 may be provided to value identifier 306. Value identifier 306 may be configured to identify value 332 of suggested placement 312. For example, value 332 may be an indication of the savings that may be realized if suggested placement 312 is selected by user 302 for the placement of the structure in the design of the interior of a platform. For example, without limitation, value identifier 306 may be configured to identify the relative value among a plurality of suggested placement 312 identified by suggested placement identifier 305.

Value identifier 306 may use information in value database 334 to determine value 332 for suggested placement 312. For example, value database 334 may include information for identifying the value of number of structure placement engineering designs 314. For example, without limitation, number of structure placement engineering designs 314 for a structure that requires a relatively larger amount of engineering time to implement may be associated with a higher value in value database 334. Value database 334 may be implemented using any appropriate database structure. Value database 334 may be implemented in whole or in part as part of design configuration tool 300 or separate from, but accessible by, design configuration tool 300. In one example, value database 334 may be implemented as part of engineering design database 316.

Value identifier 306 may be configured to use value rules 336 to determine value 332 for suggested placement 312 given the value information in value database 334. For example, value rules 336 may define how information in value database 334 is to be used to determine value 332 for suggested placement 312 for a particular user 302 of design configuration tool 300.

Value 332 of suggested placement 312 may be displayed to user 302 on graphical user interface 309 along with suggested placement 312. For example, value indicator 338 may be displayed to user 302 on user interface 308 along with suggested placement 312 to indicate value 332 of suggested placement 312. Any appropriate form for value indicator 338 may be used to indicate value 332 of suggested placement 312 to user 302 on user interface 308. For example, without limitation, value indicator 338 may indicate value 332 of suggested placement 312 using numbers, letters, words, colors, or other indications for indicating the relative value of suggested placement 312. Suggested placement 312 also may be ordered by value 340 in the display of suggested placement 312 on user interface 308.

User interface 308 may be configured to receive selected placement 342 from user 302. For example, user 302 may use user interface 308 to select suggested placement 312 to be selected placement 342. Alternatively, user 302 may select initial placement 310, or another placement, for selected placement 342.

Selected placement identifier 307 may be configured to identify selected placement 342 selected by user 302. Selected placement identifier 307 may associate prior design identification 344 with suggested placement 342 in response to user 302 selecting suggested placement 312 for selected placement 342. Prior design identification 344 may include information for identifying number of structure placement engineering designs 314 in engineering design database that correspond to selected placement 342.

Selected placement 342 and prior design identification 344 may be provided to engineer 346. Engineer 346 may then create structure placement engineering design 348 for selected placement 342. When prior design identification 344 is associated with selected placement 342, engineer 346 may use existing number of structure placement engineering designs 314 in engineering design database 316, as identified by prior design identification 344, to create structure placement engineering design 348. In this case, the time and effort required by engineer 346 to create structure placement engineering design 348 may be reduced. After completion, structure placement engineering design 348 may be added to engineering design database 316. Adding structure placement engineering design 348 to engineering design database 316 increases number of structure placement engineering designs 314 that may be available to be identified as suggested placement 312 by design configuration tool 300.

The illustrations of FIGS. 1-3 are not meant to imply physical or architectural limitations to the manner in which different illustrative embodiments may be implemented. Other components in addition to, in place of, or both in addition to and in place of the ones illustrated may be used. Some components may be unnecessary in some illustrative embodiments. Also, the blocks are presented to illustrate some functional components. One or more of these blocks may be combined or divided into different blocks when implemented in different embodiments.

Figure 4:
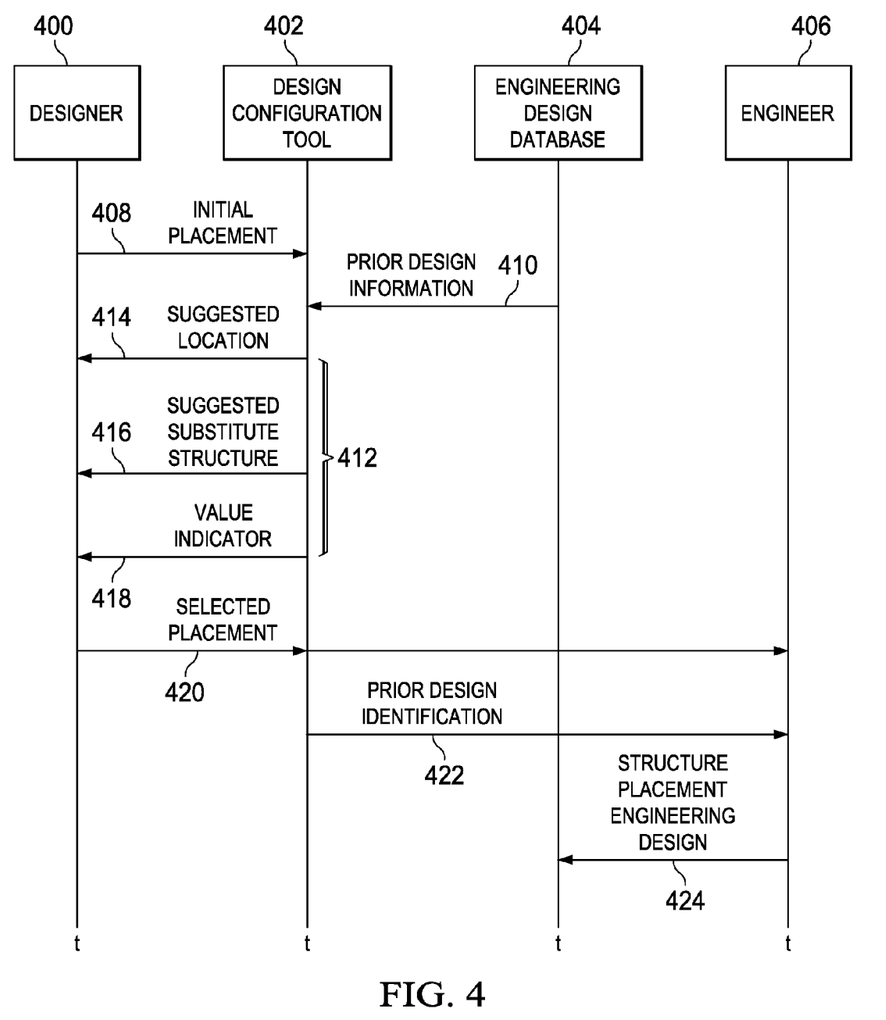
FIG. 4 is an illustration of information transfer using a design configuration tool in accordance with an illustrative embodiment.

Turning now to FIG. 4, an illustration of information transfer using a design configuration tool is depicted in accordance with an illustrative embodiment. In this example, the information transfer shown in FIG. 4 is an example of one implementation of information transfer between designer 400, design configuration tool 402, engineering design database 404, and engineer 406 using design configuration tool 114 in FIG. 1 or design configuration tool 300 in FIG. 3. Designer 400 may be an example of user 302 of design configuration tool 300 in FIG. 3. Design configuration tool 300 in FIG. 3 may be an example of one implementation of design configuration tool 402. Engineering design database 404 may be an example of engineering design database 316 in FIG. 3. Engineer 406 may be an example of engineer 346 in FIG. 3.

Designer 400 provides initial placement 408 to design configuration tool 402. For example, designer 400 may provide initial placement 408 to design configuration tool 402 via a user interface provided by design configuration tool 402. Initial placement 408 may include information identifying a structure in the location of the structure in the design for the interior of an aircraft or other platform. Initial placement 408 is, thus, received by design configuration tool 402 from designer 400.

In response to receiving initial placement 408, design configuration tool 402 may retrieve prior design information 410 from engineering design database 404. Prior design information 410 may include information for a number of structure placement engineering designs for various structures and locations in the aircraft or other platform that have already been completed and stored in engineering design database 404. Design configuration tool 402 may use prior design information 410 to identify suggested placement 412 for the given initial placement 408. Suggested placement 412 may correspond to the placement for a structure for which an engineering design already exists in engineering design database 404 and that is similar to initial placement 408.

Suggested placement 412 identified by design configuration tool 402 may be provided back to designer 400. For example, suggested placement 412 may be displayed to designer 400 on the user interface for design configuration tool 402. Suggested placement 412 displayed to designer 400 may include suggested location 414, suggested substitute structure 416, and value indicator 418 for suggested placement 412.

Designer 400 may make selected placement 420 using design configuration tool 402. For example, selected placement 420 may be suggested placement 412, initial placement 408, or some other placement selected or defined by designer 400 using the user interface provided by design configuration tool 402. Selected placement 420 may be passed from design configuration tool 402 to engineer 406. Prior design identification 422 may be associated with selected placement 420 when selected placement 420 corresponds to suggested placement 412. Prior design identification 422 may identify a prior engineering design in engineering design database 404 that corresponds to selected placement 420. Prior design identification 422 may be provided to engineer 406 along with the identification of selected placement 420.

Engineer 406 may create structure placement engineering design 424 for selected placement 420. When selected placement 420 includes prior design identification 422, engineer 406 may use a prior engineering design in engineering design database 404 as identified by prior design identification 422 for the creation of structure placement engineering design 424. After completion, structure placement engineering design 424 may be added to engineering design database 404.

Figure 5:
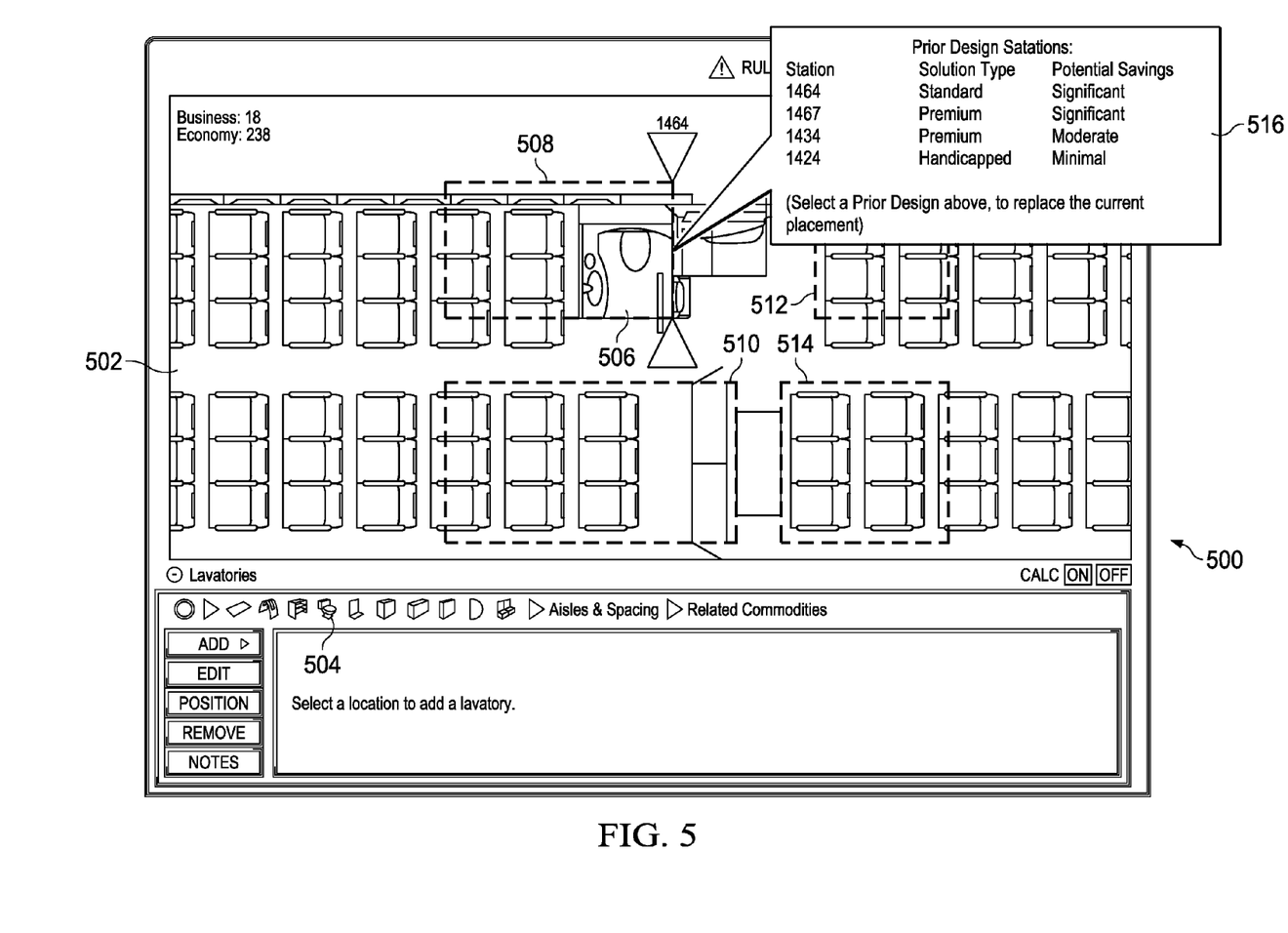
FIG. 5 is an illustration of a user interface for a design configuration tool in accordance with an illustrative embodiment.

Turning now to FIG. 5, an illustration of a user interface for a design configuration tool is depicted in accordance with an illustrative embodiment. In this example, user interface 500 is an example of one implementation of user interface 308 in FIG. 3. User interface 500 may be used for the placement of structures in the interior design of an aircraft.

In this example, user interface 500 includes graphical representation 502 of an aircraft cabin. A user may select a type of structure to be placed. In this example, various types of structures that may be placed in the design are indicated by graphical icons 504 representing the various types of structures. A user may place a structure into the design by placing a graphical representation of the structure at a desired location in graphical representation 502 of the interior of the aircraft. In this example, a user has placed the graphical representation of a lavatory at location 506 in the representation of the interior of the aircraft.

In response to the initial placement of the lavatory at location 506, suggested placements are displayed. For example, suggested placements may be displayed as graphical representations 508, 510, 512, and 514 of the suggested locations in graphical representation 502 of the interior of the aircraft. Suggested placements also may be displayed in table 516 in user interface 500. In this example, prior designs are indicated by number, type, and potential savings. In this case, potential savings provides a value indicator indicating the relative value of the various suggested placements presented in user interface 500.

Figure 6:
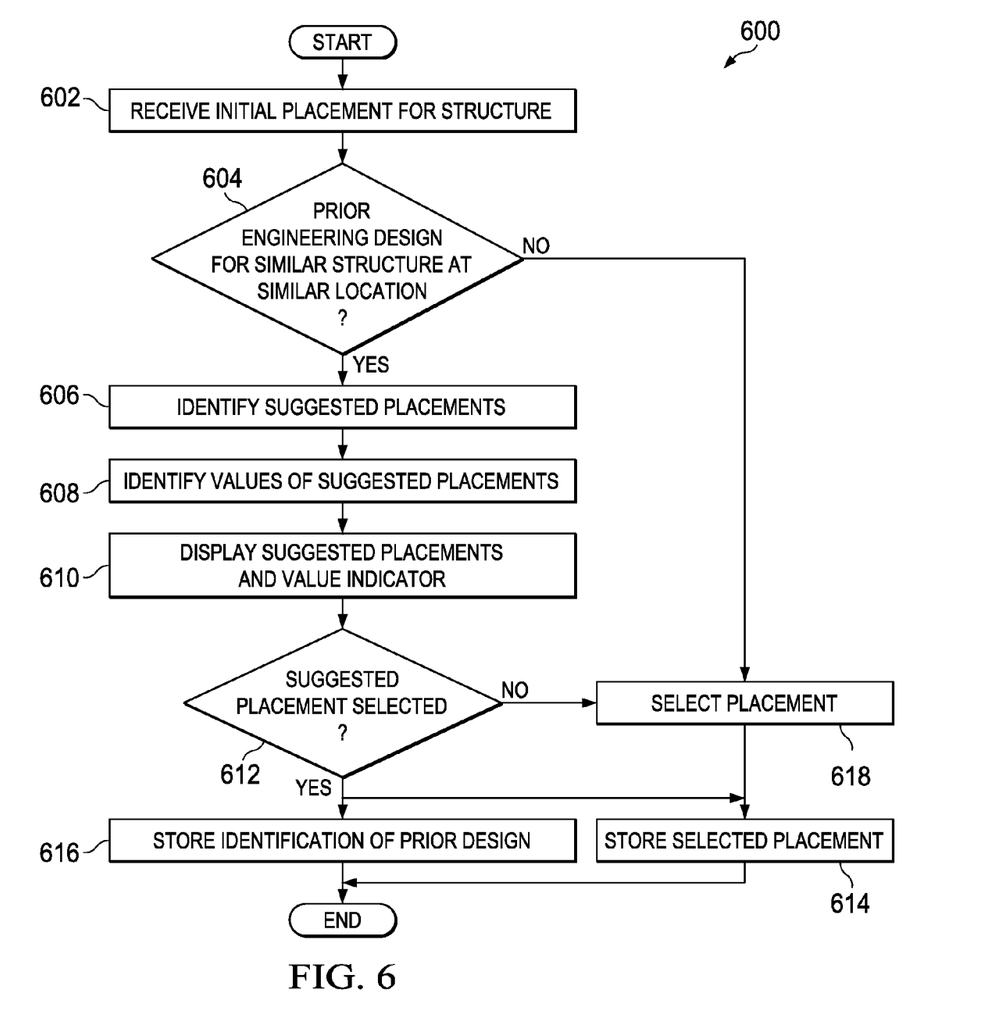
FIG. 6 is an illustration of a flowchart of a process for structure placement in accordance with an illustrative embodiment.

Turning now to FIG. 6, an illustration of a flowchart of a process for structure placement is depicted in accordance with an illustrative embodiment. In this example, process 600 may be performed using design configuration tool 300 in FIG. 3. The process begins by receiving an initial placement for a structure (operation 602). It then may be determined whether prior engineering designs for a similar structure at a similar location already exists (operation 604). If such prior engineering designs are determined to exist, suggested placements may be identified (operation 606). Values of the suggested placements also may be identified (operation 608). The suggested placements and indicators for the values of the suggested placements then may be displayed to a user (operation 610).

It then may be determined whether the user selects a suggested placement (operation 612). If the user selects a suggested placement, the suggested placement is stored (operation 614) along with an identification of the prior design corresponding to the selected suggested placement (operation 616) with the process terminating thereafter.

If it is determined at operation 604 that a prior engineering design for a similar structure in a similar location to the initial placement does not exist, the user may select a placement (operation 618) that corresponds to the initial placement or another placement for the structure in the design. Similarly, if the user does not select a suggested placement at operation 612, the user may select placement at operation 618 that corresponds to the initial placement or another placement for the structure in the design. In either case, the selected placement is stored at operation 614, with the process terminating thereafter.

Figure 7:
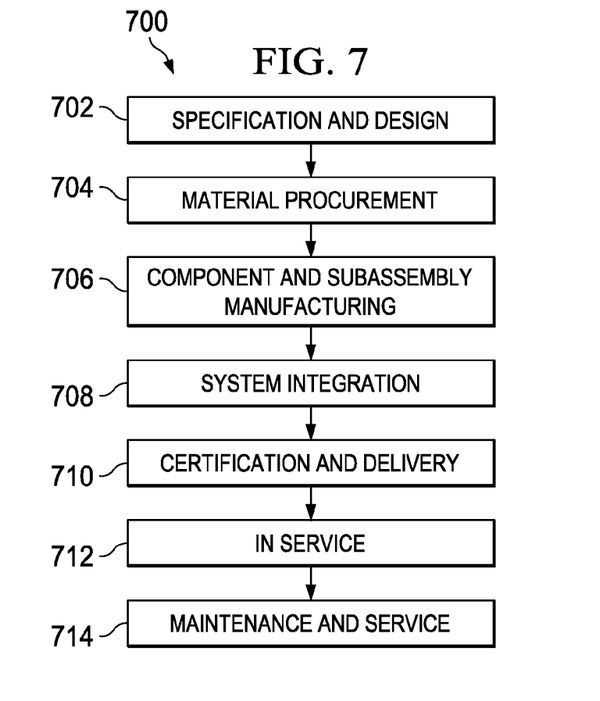
FIG. 7 is an illustration of a block diagram of an aerospace vehicle manufacturing and service method in accordance with an illustrative embodiment.
Figure 8:
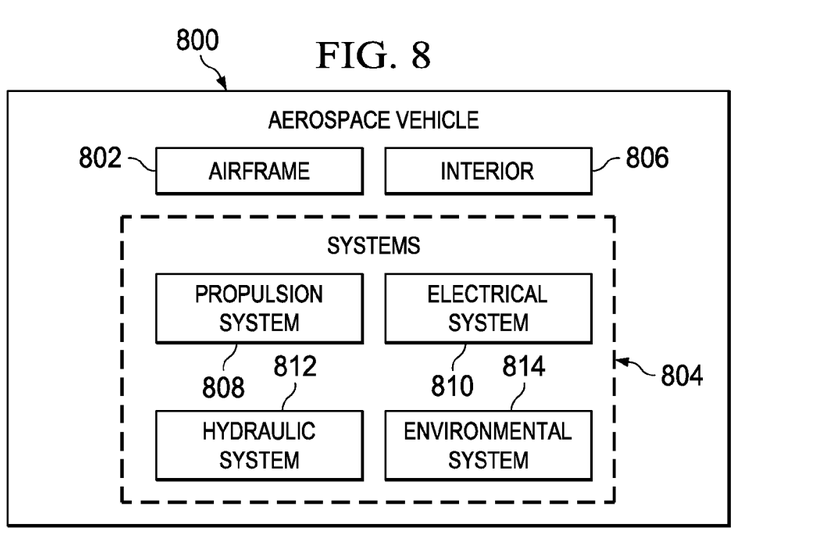
FIG. 8 is an illustration of a block diagram of an aerospace vehicle for which an illustrative embodiment may be implemented.

Illustrative embodiments of the disclosure may be described in the context of aerospace vehicle manufacturing and service method 700 as shown in FIG. 7 and aerospace vehicle 800 as shown in FIG. 8. Turning first to FIG. 7, an illustration of a block diagram of an aerospace vehicle manufacturing and service method is depicted in accordance with an illustrative embodiment.

During pre-production, aerospace vehicle manufacturing and service method 700 may include specification and design 702 of aerospace vehicle 800 in FIG. 8 and material procurement 704. During production, component and subassembly manufacturing 706 and system integration 708 of aerospace vehicle 800 in FIG. 8 takes place. Thereafter, aerospace vehicle 800 in FIG. 8 may go through certification and delivery 710 in order to be placed in service 712.

While in service by a customer, aerospace vehicle 800 in FIG. 8 is scheduled for routine maintenance and service 714, which may include modification, reconfiguration, refurbishment, and other maintenance or service. In this example, aerospace vehicle manufacturing and service method 700 is shown as a method for aerospace vehicles, including manned and unmanned aircraft. The different illustrative embodiments may be applied to other types of manufacturing and service methods, including manufacturing and service methods for other types of platforms, including other types of vehicles.

Each of the processes of aerospace vehicle manufacturing and service method 700 may be performed or carried out by a system integrator, a third party, an operator, or by any combination of such entities. In these examples, the operator may be a customer. For the purposes of this description, a system integrator may include, without limitation, any number of aerospace vehicle manufacturers and major-system subcontractors; a third party may include, without limitation, any number of venders, subcontractors, and suppliers; and an operator may be a company, a military entity, a service organization, and so on.

With reference now to FIG. 8, an illustration of a block diagram of an aerospace vehicle in which an illustrative embodiment may be implemented is depicted. In this illustrative example, aerospace vehicle 800 is produced by aerospace vehicle manufacturing and service method 700 in FIG. 7. Aerospace vehicle 800 may include an aircraft, a spacecraft, or any other vehicle for traveling through the air, for traveling through space, or which is capable of operation in both air and space. Aerospace vehicle 800 may include airframe 802 with systems 804 and interior 806. Examples of systems 804 include one or more of propulsion system 808, electrical system 810, hydraulic system 812, and environmental system 814. For example, illustrative embodiments may be used to place structures in a design for interior 806 of aerospace vehicle 800.

Apparatuses and methods embodied herein may be employed during at least one of the stages of aerospace vehicle manufacturing and service method 700 in FIG. 7. As used herein, the phrase "at least one of," when used with a list of items, means that different combinations of one or more of the listed items may be used and only one of each item in the list may be needed. For example, "at least one of item A, item B, and item C" may include, for example, without limitation, item A, or item A and item B. This example also may include item A, item B, and item C, or item B and item C.

In one illustrative example, components or subassemblies produced in component and subassembly manufacturing 706 in FIG. 7 may be fabricated or manufactured in a manner similar to components or subassemblies produced while aerospace vehicle 800 is in service 712 in FIG. 7.

As yet another example, a number of apparatus embodiments, method embodiments, or a combination thereof may be utilized during production stages, such as component and subassembly manufacturing 706 and system integration 708 in FIG. 7. "A number," when referring to items, means one or more items. For example, "a number of apparatus embodiments" is one or more apparatus embodiments. A number of apparatus embodiments, method embodiments, or a combination thereof may be utilized while aerospace vehicle 800 is in service 712, during maintenance and service 714, or both.

The use of a number of the different illustrative embodiments may substantially expedite the assembly of aerospace vehicle 800. A number of the different illustrative embodiments may reduce the cost of aerospace vehicle 800. For example, one or more of the different illustrative embodiments may be used during specification and design 702 or during other production stages. The different illustrative embodiments may be used during these parts of aerospace vehicle manufacturing and service method 700 to place structures in a design for interior 806 of aerospace vehicle 800.

Figure 9:
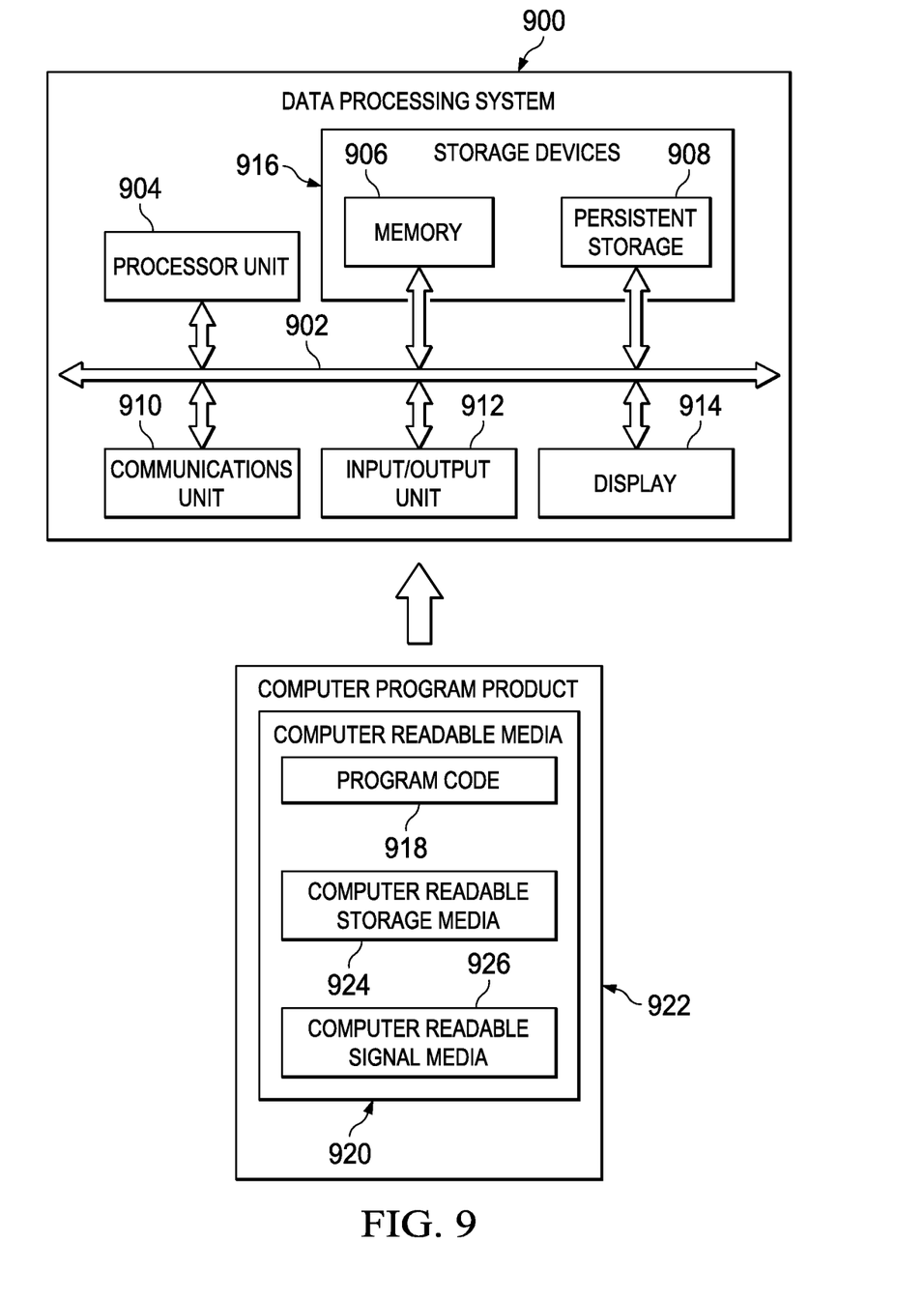
FIG. 9 is an illustration of a data processing system in accordance with an illustrative embodiment.

Turning now to FIG. 9, an illustration of a data processing system is depicted in accordance with an illustrative embodiment. In this example, data processing system 900 is an example of one implementation of a data processing system in which design configuration tool 114 in FIG. 1 and design configuration tool 300 in FIG. 3 may be implemented.

In this illustrative example, data processing system 900 includes communications fabric 902. Communications fabric 902 provides communications between processor unit 904, memory 906, persistent storage 908, communications unit 910, input/output unit 912, and display 914. Memory 906, persistent storage 908, communications unit 910, input/output unit 912, and display 914 are examples of resources accessible by processor unit 904 via communications fabric 902.

Processor unit 904 serves to run instructions for software that may be loaded into memory 906. Processor unit 904 may be a number of processors, a multi-processor core, or some other type of processor, depending on the particular implementation. Further, processor unit 904 may be implemented using a number of heterogeneous processor systems in which a main processor is present with secondary processors on a single chip. As another illustrative example, processor unit 904 may be a symmetric multi-processor system containing multiple processors of the same type.

Memory 906 and persistent storage 908 are examples of storage devices 916. A storage device is any piece of hardware that is capable of storing information such as, for example, without limitation, data, program code in functional form, and/or other suitable information either on a temporary basis and/or a permanent basis. Storage devices 916 may also be referred to as computer readable storage devices in these examples. Memory 906, in these examples, may be, for example, a random access memory or any other suitable volatile or non-volatile storage device. Persistent storage 908 may take various forms, depending on the particular implementation.

For example, persistent storage 908 may contain one or more components or devices. For example, persistent storage 908 may be a hard drive, a flash memory, a rewritable optical disk, a rewritable magnetic tape, or some combination of the above. The media used by persistent storage 908 also may be removable. For example, a removable hard drive may be used for persistent storage 908.

Communications unit 910, in these examples, provides for communications with other data processing systems or devices. In these examples, communications unit 910 is a network interface card. Communications unit 910 may provide communications through the use of either or both physical and wireless communications links.

Input/output unit 912 allows for input and output of data with other devices that may be connected to data processing system 900. For example, input/output unit 912 may provide a connection for user input through a keyboard, a mouse, and/or some other suitable input device. Further, input/output unit 912 may send output to a printer. Display 914 provides a mechanism to display information to a user.

Instructions for the operating system, applications, and/or programs may be located in storage devices 916, which are in communication with processor unit 904 through communications fabric 902. In these illustrative examples, the instructions are in a functional form on persistent storage 908. These instructions may be loaded into memory 906 for execution by processor unit 904. The processes of the different embodiments may be performed by processor unit 904 using computer-implemented instructions, which may be located in a memory, such as memory 906.

These instructions are referred to as program instructions, program code, computer usable program code, or computer readable program code that may be read and executed by a processor in processor unit 904. The program code in the different embodiments may be embodied on different physical or computer readable storage media, such as memory 906 or persistent storage 908.

Program code 918 is located in a functional form on computer readable media 920 that is selectively removable and may be loaded onto or transferred to data processing system 900 for execution by processor unit 904. Program code 918 and computer readable media 920 form computer program product 922 in these examples. In one example, computer readable media 920 may be computer readable storage media 924 or computer readable signal media 926.

Computer readable storage media 924 may include, for example, an optical or magnetic disk that is inserted or placed into a drive or other device that is part of persistent storage 908 for transfer onto a storage device, such as a hard drive, that is part of persistent storage 908. Computer readable storage media 924 also may take the form of a persistent storage, such as a hard drive, a thumb drive, or a flash memory, that is connected to data processing system 900. In some instances, computer readable storage media 924 may not be removable from data processing system 900.

In these examples, computer readable storage media 924 is a physical or tangible storage device used to store program code 918 rather than a medium that propagates or transmits program code 918. Computer readable storage media 924 is also referred to as a computer readable tangible storage device or a computer readable physical storage device. In other words, computer readable storage media 924 is a media that can be touched by a person.

Alternatively, program code 918 may be transferred to data processing system 900 using computer readable signal media 926. Computer readable signal media 926 may be, for example, a propagated data signal containing program code 918. For example, computer readable signal media 926 may be an electromagnetic signal, an optical signal, or any other suitable type of signal. These signals may be transmitted over communications links, such as wireless communications links, optical fiber cable, coaxial cable, a wire, or any other suitable type of communications link. In other words, the communications link or the connection may be physical or wireless in the illustrative examples.

In some illustrative embodiments, program code 918 may be downloaded over a network to persistent storage 908 from another device or data processing system through computer readable signal media 926 for use within data processing system 900. For instance, program code stored in a computer readable storage medium in a server data processing system may be downloaded over a network from the server to data processing system 900. The data processing system providing program code 918 may be a server computer, a client computer, or some other device capable of storing and transmitting program code 918.

The different components illustrated for data processing system 900 are not meant to provide architectural limitations to the manner in which different embodiments may be implemented. The different illustrative embodiments may be implemented in a data processing system including components in addition to and/or in place of those illustrated for data processing system 900. Other components shown in FIG. 9 can be varied from the illustrative examples shown. The different embodiments may be implemented using any hardware device or system capable of running program code. As one example, data processing system 900 may include organic components integrated with inorganic components and/or may be comprised entirely of organic components excluding a human being. For example, a storage device may be comprised of an organic semiconductor.

In another illustrative example, processor unit 904 may take the form of a hardware unit that has circuits that are manufactured or configured for a particular use. This type of hardware may perform operations without needing program code to be loaded into a memory from a storage device to be configured to perform the operations.

For example, when processor unit 904 takes the form of a hardware unit, processor unit 904 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 918 may be omitted, because the processes for the different embodiments are implemented in a hardware unit.

In still another illustrative example, processor unit 904 may be implemented using a combination of processors found in computers and hardware units. Processor unit 904 may have a number of hardware units and a number of processors that are configured to run program code 918. With this depicted example, some of the processes may be implemented in the number of hardware units, while other processes may be implemented in the number of processors.

In another example, a bus system may be used to implement communications fabric 902 and may be comprised of one or more buses, such as a system bus or an input/output bus. Of course, the bus system may be implemented using any suitable type of architecture that provides for a transfer of data between different components or devices attached to the bus system.

Additionally, communications unit 910 may include a number of devices that transmit data, receive data, or transmit and receive data. Communications unit 910 may be, for example, a modem or a network adapter, two network adapters, or some combination thereof. Further, a memory may be, for example, memory 906, or a cache, such as found in an interface and memory controller hub that may be present in communications fabric 902.

The flowcharts and block diagrams in the different depicted embodiments illustrate the structure, functionality, and operation of some possible implementations of apparatuses and methods in different illustrative embodiments. In this regard, each block in the flowcharts or block diagrams may represent a module, segment, function, or a portion of an operation or step. In some alternative implementations, the function or functions noted in the blocks may occur out of the order noted in the figures. For example, in some cases, two blocks shown in succession may be executed substantially concurrently, or the blocks may sometimes be executed in the reverse order, depending upon the functionality involved.

The description of the different illustrative embodiments has been presented for purposes of illustration and description, and is not intended to be exhaustive or to limit the embodiments in the form disclosed. Many modifications and variations will be apparent to those of ordinary skill in the art. Further, different illustrative embodiments may provide different advantages as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus, comprising:
an engineering design database comprising a number of structure placement engineering designs, wherein each structure placement engineering design comprises information identifying a placement position for a structure in a platform;
a user interface configured to display a number of graphical icons representing various types of structures and a structure to be placed, and receive an initial placement based on a desired initial position for the structure in a design, and to display a plurality of suggested placements for the structure;
a suggested placement identifier configured to determine the plurality of suggested placements for the structure from the number of structure placement engineering designs by using the design and the initial placement for the structure; and
a value identifier configured to identify a value for each suggested placement in the plurality of suggested placements, wherein each value indicates an amount of savings relative to a value of the initial placement, and wherein the user interface is configured to display value indicators indicating the value for each suggested placement in the plurality of suggested placements;
wherein each suggested placement in the plurality of suggested placements correspond to prior placements in designs for an interior for which structure placement engineering designs have already been developed; and
wherein the design is implemented using a suggested placement in the plurality of suggested placements for the structure to manufacture the platform.

2. The apparatus of claim 1, wherein:
the initial placement comprises a location for the structure identified in the initial position;
the suggested placement identifier is configured to identify the plurality of suggested placements as a number of alternative suggested placements for the structure corresponding to prior engineering designs for structures similar to the identified structure having a design location similar to the initial placement location; and
the suggested placement comprises a suggested location for the structure identified in the identified initial placement.

3. The apparatus of claim 2, wherein:
the initial placement comprises the location in an area of the design;
the suggested placement identifier is configured to identify the number of structure placement engineering designs for the area; and
the amount of savings represents an amount of engineering time that is saved and a cost of the platform that is reduced by using the suggested placement.

4. The apparatus of claim 1, wherein:
the suggested placement identifier is configured to identify the number of structure placement engineering designs for a similar structure to the structure; and the suggested placement comprises a suggested substitute structure for the structure.

5. The apparatus of claim 4, wherein:
the structure is defined by a type of the structure; and
the suggested placement identifier is configured to identify the number of structure placement engineering designs for the type of the structure.

6. The apparatus of claim 1, wherein the platform is an aircraft, and wherein the structure is in the design for an interior of the aircraft and is selected from a lavatory, a galley, a closet, a bar unit, seats, a wall, a divider, and a partition.

7. The apparatus of claim 1, wherein the graphical icons represent a lavatory, a galley, a closet, a bar unit, a seat, a wall, a divider, and a partition.

8. A method for placing a structure in a design in a platform, comprising:
using a processor unit to perform the steps of:
displaying a number of graphical icons representing various types of structures;
receiving a user selection, from the graphical icons, of a structure to be placed at a desired initial location;
receiving an initial placement for the structure comprising a location for the structure in the design based on the initial location;
identifying a number of structure placement engineering designs in an engineering design database for a similar structure to the structure and with a similar location to the location;
displaying a plurality of suggested placements for the structure comprising suggested locations for the structure and a suggested substitute structure for the structure corresponding to the number of structure placement engineering designs, wherein each suggested placement in the plurality of suggested placements corresponds to a prior placement in a design for an interior for which structure placement engineering designs have already been developed; and
displaying value indicators configured to display a value for each suggested placement in the plurality of suggested placements, wherein each value indicates an amount of savings relative to a value of the initial placement; and
implementing the design using a suggested placement in the plurality of suggested placements for the structure to manufacture the platform.

9. The method of claim 8, wherein:
the initial placement comprises the location in an area of the design for an interior of an aircraft;
identifying the number of structure placement engineering designs with the similar location to the location comprises identifying the number of structure placement engineering designs for the area; and
the amount of savings represents an amount of engineering time that is saved and a cost of the platform that is reduced by using the suggested placement.

10. The method of claim 8, wherein:
the structure comprises a type of the structure; and
identifying the number of structure placement engineering designs for the similar structure to the structure comprises identifying the number of structure placement engineering designs for the type of the structure.

11. The method of claim 8, wherein the structure is in the design for an interior of an aircraft.

12. The method of claim 11, wherein the structure is selected from a lavatory, a galley, a closet, a bar unit, seats, a wall, a divider, and a partition.

13. A method for placing a structure in a design for an interior of an aircraft, comprising:
using a processor unit to perform the steps of:
displaying a number of graphical icons representing various types of structures;
receiving a user selection, from the graphical icons, of a structure to be placed at a desired initial location;
receiving an initial placement for the structure based on the initial location;
identifying a plurality of suggested placements for the structure from a number of structure placement engineering designs in an engineering design database for the aircraft using the initial placement, wherein each suggested placement in the plurality of suggested placements corresponds to a prior placement in a design for an interior for which structure placement engineering designs have already been developed;
displaying the plurality of suggested placements for the structure; and
displaying value indicators configured to display a value for each suggested placement in the plurality of suggested placements, wherein each value indicates an amount of savings relative to a value of the initial placement; and
implementing the design using a suggested placement in the plurality of suggested placements for the structure to manufacture the aircraft.

14. The method of claim 13, wherein:
the initial placement comprises a location for the structure identified in the initial placement; and
identifying the plurality of suggested placements as alternative suggested placements for the structure corresponding to prior engineering designs for structures similar to the identified structure having a design location similar to the initial placement location, and the suggested placement comprises a suggested location for the structure identified in the initial placement.

15. The method of claim 14, wherein:
the initial placement comprises the location in an area of the design for the interior of the aircraft;
identifying the suggested placement for the structure comprises identifying the number of structure placement engineering designs for the area; and
wherein the amount of savings represents an amount of engineering time that is saved and a cost of the platform that is reduced by using the suggested placement.

16. The method of claim 13, wherein:
identifying the suggested placement for the structure comprises identifying the number of structure placement engineering designs for a similar structure to the structure; and
displaying the suggested placement for the structure comprises displaying a suggested substitute structure for the structure.

17. The method of claim 16, wherein:
the structure comprises a type of the structure; and
identifying the suggested placement for the structure comprises identifying the number of structure placement engineering designs for the type of the structure.

18. The method of claim 13, wherein the structure is selected from a lavatory, a galley, a closet, a bar unit, seats, a wall, a divider, and a partition.

* * * * *

UNITED STATES PATENT AND TRADEMARK OFFICE
CERTIFICATE OF CORRECTION

PATENT NO. : 9,679,102 B2  
APPLICATION NO. : 13/860846  
DATED : June 13, 2017  
INVENTOR(S) : Lindgren et al.

Page 1 of 1

It is certified that error appears in the above-identified patent and that said Letters Patent is hereby corrected as shown below:

Column 19, Line 4, "is defined by" should be --comprises--.

Signed and Sealed this
Tenth Day of July, 2018

Andrei Iancu
*Director of the United States Patent and Trademark Office*